US005309047A

United States Patent [19]

Tiede et al.

[11] Patent Number: 5,309,047

[45] Date of Patent: May 3, 1994

[54] DIFFERENTIAL SENSE AMPLIFIER WITH CROSS CONNECTED REFERENCE CIRCUITS

[75] Inventors: John W. Tiede; Albert S. Weiner, both of Colorado Springs, Colo.

[73] Assignee: Simtek Corporation, Colorado Springs, Colo.

[21] Appl. No.: 839,910

[22] Filed: Feb. 21, 1992

[51] Int. Cl.[5] .......................... H03F 3/45; H03K 3/26

[52] U.S. Cl. .................................... 307/530; 307/279; 307/350; 307/355

[58] Field of Search ................ 307/279, 530, 350, 355

[56] References Cited

U.S. PATENT DOCUMENTS 4,523,110 6/1985 Johnson .............................. 307/355

4,766,333 8/1988 Mobley ............................... 307/530

*Primary Examiner*—Margaret R. Wambach

*Attorney, Agent, or Firm*—Sheridan Ross & McIntosh

[57] ABSTRACT

One embodiment of the differential sense amplifier of the present includes a pair of amplifier portions, each of which includes a reference branch and an amplifying branch. Each amplifier portion amplifies one input signal of the differential input signal applied to the differential sense amplifier by an amount related to the difference between the applied input signal and a reference signal established by the reference branch of the amplifier portion. The input signals are cross-coupled between the amplifier portions so that each input signal is applied to the reference branch of one amplifier portion and to the amplifying branch of the other amplifier portion. Separate reference nodes and reference signals are established for each amplifier portion. A change in the differential input signal creates correspondingly opposite changes in the magnitude of the reference signal and the input signal applied to the amplifying branch of both amplifier portions to provide greater gain and sensitivity.

27 Claims, 8 Drawing Sheets

DIFFERENTIAL SENSE AMPLIFIER WITH CROSS CONNECTED REFERENCE CIRCUITS

BACKGROUND OF THE INVENTION

1. Field of the Invention

This invention relates to a differential sense amplifier that is typically employed as a first stage amplifier to amplify the output signals from a memory cell of a semiconductor memory array integrated circuit. More particularly, the present invention relates to an improved differential sense amplifier that is capable, among other things, of responding to input signals close to the power supply voltage after equilibration and supplying an amplified differential output signal at a new signal level.

2. Description of the Related Art

The typical differential sense amplifier is used to amplify the output signals of a memory cell of a semiconductor memory array integrated circuit (IC) that are provided over a pair of bit lines, which are typically distinguished from one another by use of the terms "TRUE" bit line and "COMPLEMENT" bit line. Each memory cell supplies two differentially related output signals that together constitute a differential signal and represent the two logical states of the cell. In one logical state, one of the cell output signals is higher than the other, and in the other logical state, the cell output signals have the opposite relative relationship. Typically, the difference between the memory cell output signals is relatively small, for example, 0.3–0.7 volts for differential sense amplifiers that use insulated gate field-effect transistors (IGFET) and 0.1 volt or less for differential sense amplifiers that are other types of transistors, such as bipolar transistors. Consequently, the typical differential sense amplifier must be capable of responding to this relatively small differential signal in order to accurately represent the logical state of the memory cell. Moreover, the smaller the differential signal to which the differential sense amplifier can respond, the faster or more responsive the differential sense amplifier is considered to be.

The array of memory cells is usually a pattern of orthogonal rows and columns. The bit lines in a typical memory array IC connect the output signal terminals of all of the memory cells in a column of the array to the output bus and the input signal terminals of the differential sense amplifier. A word line connects all of the memory cells in a row. To address a single cell in the array to read its logical state, an access signal is applied to the word line of the row containing the addressed cell, and the input signal terminals of the differential sense amplifier are connected to the bit lines of the column which contains the addressed memory cell. The output signals from the addressed memory cell create signal levels on the bit lines, and the differential sense amplifier responds to these signal levels.

One factor that adversely affects the response of a differential sense amplifier is the capacitance of the bit line and other signal conductors. More specifically, relatively long bit lines are required to connect all the cells in each column. The length of these bit lines creates a significant capacitance associated with each bit line that the cell output signals must charge or discharge before the differential sense amplifier can accurately respond to the logical state of the addressed cell. Charging or discharging the bit line capacitance delays the application of the memory cell output signals to the differential sense amplifier, which in turn delays the response of the differential sense amplifier and the delivery of an output signal from the memory array IC representative of the logical state of the addressed memory cell. Such delays adversely lengthen the access time of the memory array IC. The access time is a performance criterion of a memory array IC which relates to that amount of time between the application of an address signal and obtaining a reliable signal representative of the logical state of the addressed memory cell. Although many modern memory IC's have access times in the range of tens of nanoseconds, there is a continual need to further reduce the access time and thereby improve performance.

A well known technique for reducing the adverse effects of the bit line capacitance on the access time is to equilibrate the bit lines just before sensing the signal levels on them. Equilibration involves connecting both bit lines to a common reference potential, usually the array power supply voltage, $V_{cc}$ or $V_{ss}$, and thereafter disconnecting the bit lines from the common reference potential so that the signals on the bit lines can move differentially toward the output signal levels of the addressed memory cell. Since the internal signal nodes of the addressed memory cell are at different levels with respect to one another, the voltage difference between the bit lines will increase as they are differentially discharged by the cell. However, due to the high loads on the bit lines when IGFET differential sense amplifiers and similar devices are employed, the output signal levels are at voltage levels that are very close to power supply voltage. Further, as previously mentioned, the voltage differences between the bit line signals is quite small at steady-state, typically on the order of 0.3–0.7 volts for IGFET based differential sense amplifiers and 0.1 volts for differential sense amplifiers that are other transistor technologies. If the differential sense amplifier has the ability to correctly respond to signal levels that are very near to the power supply voltage and to the relatively small signal difference on the bit lines even before the bit line signals reach the steady-state levels established by the cell output signals, then the response time of the differential sense amplifier will decrease, as will the access time of the memory IC. In summary, if the differential sense amplifier can respond to differential input signals very close to the magnitude of the power supply voltage, $V_{cc}$ or $V_{ss}$, from which the bit lines start decaying after equilibration and/or to relatively small differential signal levels, then an improved response time for the differential amplifier and improved access time of the memory IC can be realized.

Additionally, typical differential sense amplifiers should achieve a high degree of amplification or gain. Generally, multiple stages of series connected differential sense amplifiers are used to obtain adequate amplification of the signals provided by a memory cell. The number of differential sense amplifier stages has a direct impact on the access time because each stage contributes an additional delay due to its own capacitance. Consequently, the higher the gain of each differential sense amplifier stage, the fewer the stages that are required and the less the access time of the memory IC.

It is also desirable that the first stage differential sense amplifier shift its output signals to levels which are better for driving the subsequent amplifier stage. Shifting the signals to a better level allows the use of differential sense amplifiers in the second and subsequent stages that are capable of fast response times and high gain. The high gain of the subsequent stages reduces the number of amplifier stages required for adequate signal amplification and, in so doing, the access time of the memory IC.

A differential sense amplifier 20 that is illustrative of the known art is illustrated in FIG. 1, and is disclosed more completely in U.S. Pat. No. 4,766,333. The differential sense amplifier is hereinafter referred to, in many cases, simply as amplifier 20. The amplifier 20 is formed using complementary metal oxide semiconductor (CMOS) field-effect transistor (FET) integrated circuit technology. The amplifier 20 includes two identical amplifier portions 20*a* and 20*b*. Each amplifier portion 20*a* and 20*b* utilizes two P-channel FETs 22*a*, 26*a* and 22*b*, 26*b*, and two N-channel FETs 24*a*, 28*a* and 24*b*, 28*b*, respectively. The transistors 22*a* and 24*a* form a reference branch of the amplifier portion 20*a*, and the transistors 26*a* and 28*a* form an amplifying branch of the amplifier portion 20*a*. The transistors 22*b* and 24*b* form a reference branch of the amplifier portion 20*b*, and transistors 26*b* and 28*b* form an amplifying branch of the amplifier portion 20*b*. One differential input signal to the amplifier 20, $V_{in}$ (TRUE), is applied to the amplifier portion 20*a* at input terminal 30*a*, and the other differential input signal to the amplifier 20, $V_{in}$ (COMPLEMENT), is applied to the amplifier portion 20*b* at input terminal 30*b*. One amplified differential output signal from the amplifier 20, $V_{out}$ (TRUE), is supplied by the amplifier portion 20*a* at output terminal 32*a*, and the other differential output signal from the amplifier 20, $V_{OUT}$ (COMPLEMENT), is supplied by the amplifier portion 20*b* at output terminal 32*b*. The two amplifier portions 20*a* and 20*b* are connected together at a single reference node 34, which commonly connects the gates of all the FETs of the amplifier 20. Further, the source terminals of transistors 24*a*, 24*b*, 28*a*, and 28*b* are connected to a reference voltage $V_{ss}$ at node 36.

The input signals, $V_{in}$ (TRUE) and $V_{in}$ (COMPLEMENT), provided to the amplifier 20 at the input terminals 30*a* and 30*b* are delivered by the bit lines at voltage levels that are near but slightly below the power supply voltage ($V_{cc}$) for the memory array IC immediately after equilibration. The output signals at the output terminals 32*a* and 32*b* are supplied at levels generally midway between the power supply voltage ($V_{cc}$) and the reference voltage at node 36 ($V_{ss}$). A single reference signal exists at the reference node 34 and is applied to gates of all of the FETs of the amplifier 20. The reference signal at node 34 is established by the magnitude of the input signals at terminals 30*a* and 30*b*, and by the self-biased feedback connection of the reference branch transistors 22*a*, 24*a*, 22*b* and 24*b*, as shown.

The operation of the differential sense amplifier 20 can be understood by referring to FIG. 2A, which illustrates an inverter circuit 38. The inverter circuit 38 includes a P-channel field-effect transistor (FET) 40 that is connected to an N-channel FET 42 as shown. An input terminal 44 for providing an input signal $V_{in}$ to the inverter circuit 38 is connected to the gate terminals of both the P-channel FET 40 and the N-channel FET 42. An output terminal 46 for providing the output signal $V_{out}$ is connected to the drain terminal of the P-channel FET 40 and the drain terminal of the N-channel FET 42. Although not illustrated, the substrate of the P-channel FET 40 is connected to power supply $V_{cc}$, and the substrate of the N-channel FET 42 is connected to the power supply $V_{ss}$. With reference to FIG. 2B, the inverter circuit 38 provides a substantially constant high output signal for input signals with low voltages. However, once the input signal attains or exceeds a threshold voltage, the inverter circuit provides a low voltage output signal. Stated another way, the inverter circuit 38 provides a high output signal for a low input signal and a low output signal for a high input signal. The threshold voltage at which the inverter circuit 38 transitions between providing a high output signal and a low input signal is referred to hereinafter as $V_{ref}$.

The inverter circuit 38 shown in FIG. 2A can also be used as a cascode amplifier 50, which is illustrated in FIG. 3A. The difference between the cascode amplifier 50 and the inverter 38 is that the voltage $V_{ref}$ is applied to the gates of the P-channel FET 40 and the N-channel FET 42 rather than the input signal $V_{in}$. Consequently, the P-channel FET 40 and the N-channel FET 42 are now biased with $V_{ref}$. A further difference is that the input signal $V_{in}$ is applied to the source of the P-channel FET 40 in the cascode amplifier 50 rather than a power supply signal as in the inverter 38. However, as illustrated, the substrate of the P-channel FET 40 is still connected to $V_{cc}$ and the substrate of the N-channel FET 42 is still connected to $V_{ss}$ as in the inverter 38.

For the purpose of this discussion, it will be assumed that $V_{ref}$ is approximately midway between the power supply voltages, $V_{cc}$ and $V_{ss}$. In this condition, the N-channel FET 42 is in a saturated or "on" state. When $V_{in}$ is low, the P-channel FET 40 is in a nonconductive or "off" state because its source potential is equal to or less than $V_{ref}$. As a consequence, the $V_{out}$ is held low by the N-channel FET 42. As $V_{in}$ increases, the P-channel FET 40 becomes increasingly conductive. Once the conductivity of the P-channel FET 40 exceeds the conductivity of the N-channel FET 42, $V_{out}$ transitions abruptly from low to high to provide an amplified version of the input signal $V_{in}$. As $V_{in}$ continues to increase beyond this transition point, $V_{out}$ follows the potential of $V_{in}$.

The transfer characteristic of the cascode amplifier 50 is shown in FIG. 3B by a transfer curve 52. The transfer curve 52 includes a relatively low angle first segment 54 that is representative of the operation of the cascode amplifier 50 for input signals $V_{in}$ prior to the transition point. The low angle of the first segment 54 indicates that the output signal $V_{out}$ of the cascode amplifier 50 is an attenuated version of the input signal $V_{in}$. After the first segment 54 is a second or transition segment 56 that is representative of the operation of the cascode amplifier 50 for input signals $V_{in}$ after the transition point but prior to the point at which the output signal $V_{out}$ follows the input signal $V_{in}$. The steep angle of the second segment 56 signifies the abrupt transition of $V_{out}$ from a low to a high voltage as well as an output signal $V_{out}$ that is a substantially amplified version of the input signal $V_{in}$. Further, the second segment 56 is representative of both the P-channel FET 40 and the N-channel FET 42 operating in their respective saturation regions. Following the second segment is a third segment 58 that is representative of the operation of the cascode amplifier 50 when the output signal $V_{out}$ follows the input signal $V_{in}$. The approximate 45° angle of the third segment 58 indicates that the output signal $V_{out}$ produced by the cascode amplifier substantially follows the input signal $V_{in}$. In other words, the third segment 58 indicates that the cascode amplifier 50 produces an output signal that is neither attenuated nor amplified from the applied input signal $V_{in}$.

To utilize the circuit configuration of FIG. 2 as an amplifier, the reference voltage $V_{ref}$ must bias the FETs so that the average value of the input signal falls within the amplification range of the FETs. Stated another way, the reference voltage $V_{ref}$ must be chosen so that the average value of the input signal $V_{in}$ falls within the range of the second or transition segment 56 of the transfer curve 52 where both the P-channel FET 40 and the N-channel FET 42 are operating in their respective saturation regions. Biased in this manner, a slight change in the input signal $V_{in}$ will cause a substantial change in the output signal $V_{out}$.

Moreover, to use the cascode amplifier 50 in a differential sense amplifier, the cascode amplifier 50 must be able to accommodate an input signal that can be at one of the two levels of signals that a bit line from a memory cell can provide. If the two levels of the input signal provided by a bit line fall in the attenuation or voltage following ranges of operation of the cascode amplifier 50, signified by the first segment 54 and the third segment 58, then no amplification of the input signal $V_{in}$ will occur. If, however, the two signal levels fall within the amplification range of operation of the cascode amplifier 50 signified by the second or transition segment 56, then the cascode amplifier 50 will produce an output signal $V_{out}$ that is an amplified version of the input signal $V_{in}$.

Even though the difference between the two levels of signal provided by the bit line of a memory cell is relatively small, the difference may be large enough that the input signal $V_{in}$ to a cascode amplifier 50 will not fall within the relatively narrow amplifying range of the cascode amplifier 50. Consequently, the amplifying range of the cascode amplifier 50 must be adjusted to track or follow the input signal $V_{in}$ as it transitions between the two levels provided by the memory cell. Adjustment of the range of input signal $V_{in}$ for which the cascode amplifier 50 will provide an amplified output signal is dependent upon the value of $V_{ref}$. Stated another way, changing the value of $V_{ref}$ changes the range of input signal $V_{in}$ that the cascode amplifier will amplify. The effect of changing $V_{ref}$ from the value of $V_{ref}$ associated with the transfer curve 58 is illustrated in FIG. 3C. Transfer curve 58' shows the effect of decreasing $V_{ref}$ from the value of $V_{ref}$ that exhibited transfer curve 58. Similarly, transfer curve 58" illustrates the effect of increasing the value of $V_{ref}$ from the value of $V_{ref}$ that exhibited transfer curve 58.

The amplifier 20 shown in FIG. 1 achieves a single reference signal $V_{ref}$ for both of the amplifier portions 20*a* and 20*b* that places them in the amplifying ranges for the input signals provided by a memory cell. Stated another way, the amplifier 20 provides a reference signal $V_{ref}$ that places the amplifying portions 20*a* and 20*b* in the area of operation represented by the transition segment 56 of the transfer curve 52 (FIG. 3A). The differential sense amplifier 20 shown in FIG. 1 includes, as previously mentioned, a first amplifier portion 20*a* for amplifying the $V_{in}$ (TRUE) signal provided by one of the bit lines from a memory cell and a second amplifier portion 20*b* for amplifying the $V_{in}$ (COMPLEMENT) provided by the other bit line associated with the memory cell. The first amplifier portion 20*a* includes an amplifying branch that is configured as the cascode amplifier 50 illustrated in FIG. 3A and is formed by P-channel FET 26*a* and N-channel FET 28*a*. Similarly, the second amplifier portion 20*b* includes an amplifying branch that is also configured as the cascode amplifier 50 shown in FIG. 3A and is formed by P-channel FET 26*b* and N-channel FET 28*b*. The reference signal $V_{ref}$ for the amplifying branch of first amplifier portion 20*a* is provided using the reference branch formed by the P-channel FET 22*a* and the N-channel 24*a*. So that the reference voltage, $V_{ref}$, produced by the reference branch is appropriate to bias the amplifying branch of the first amplifier portion 20*a* in the amplification range, the P/N ratio of the reference branch FETs 22*a* and 24*a* is substantially equivalent to the P/N ratio of the amplifying branch FETs 26*a* and 28*a*. Typically, in terms of absolute size, the reference branch FETs 22*a* and 22*b* are smaller than the amplifying branch FETs 26*a* and 28*a*. Likewise, the reference signal $V_{ref}$ for the amplifying branch of the second amplifier portion 20*b* is provided using the reference branch formed by the P-channel FET 22*b* and the N-channel FET 24*b*.

Further, the P/N ratio of the reference branch FETs 22*b* and 24*b* is substantially equivalent to the P/N ratio associated with the amplifying brand FETs 26*b* and 28*b* so that the reference voltage, $V_{ref}$, produced by the reference branch is appropriate to bias the amplifying branch of the second amplifier portion 20*b*. The absolute size of the reference branch FETs 22*b* and 24*b* is typically smaller than that of the amplifying branch FETs 26*b* and 28*b*.

The reference branches of the first and second amplifier portions 20*a*, 20*b*, are each configured as the cascode amplifier 50 shown in FIG. 3A with the addition of connections for self-biasing the transistors comprising the reference branches. More specifically, self-biasing of each of the transistors in a reference branch is achieved by connecting the gate terminal of each transistor to the drain/drain connection between the two transistors that form the reference branch. The connection of the reference branches to one another at node 34 causes the reference branches to produce a single reference signal that is approximately the average of a first reference signal approximately midway between $V_{in}$ (TRUE) and $V_{ss}$ and a second reference signal approximately midway between $V_{in}$ (COMPLEMENT) and $V_{ss}$. This reference signal places the amplifying branches in the range of operation at which amplification occurs, represented by the second segment 56 of the transfer curve 52 shown in FIG. 3B.

Referring to FIG. 1, it can be appreciated that the two amplifier input signals 30*a* and 30*b* immediately after equilibration are at substantially the same level and thereafter drift toward the differential signal levels established by the memory cell and provided over the bit lines. Therefore each reference branch attempts to establish a slightly different self biased operating signal. But because both amplifier portions 20*a* and 20*b* are commonly connected at the reference node 34, the self biased operating signals of both portions effectively average to establish a single common reference signal $V_{ref}$ at the node 34.

This single reference signal at node 34 is also applied to the gates of each transistor pairs 26*a*, 28*a*, and 26*b*, 28*b* of each amplifying branch. The $V_{ref}$ signal, which is approximately the average of the two signals produced by the two reference branches, remains relatively constant, with an average value on the transition portion 56 of the transfer curve 52. As input signals of a small differential are applied, one input signal 30*a* or 30*b* will be slightly below the average point on the transfer curve and the other input signal 30*b* or 30*a* will be slightly above the average point. Because the transition portion 56 of the transfer curve 52 is almost vertical, the slight displacements of the input signals will result in more greatly separated output signals, thus achieving amplification.

There is also a need for a differential sense amplifier that, in addition to providing improved performance relative to the known differential sense amplifiers, conserves power by providing for its disablement when not in use.

Moreover, there is a need for a differential sense amplifier that is capable of latching the differential output signal it produces so the differential output signal is not dependent upon the continued application of an input signal to the differential sense amplifier and is capable of providing improved performance.

Additionally, a differential sense amplifier is needed that provides improved performance relative to known differential sense amplifiers as well as providing for its placement in a known state prior to use by equilibration of the input terminals and/or equalization of the output terminals.

It is against this background information relative to the prior art differential sense amplifier such as that shown in FIG. 1, and the desire to further reduce the access time of a memory array IC, as well as other considerations, that the present invention has evolved.

SUMMARY OF THE INVENTION

The present invention provides an improved differential sense amplifier that is responsive to input signals close to the power supply voltage, as typically occurs after equilibration, and that supplies a differential output signal with a relatively greater degree of amplification and at a shifted level that is more appropriate for a subsequent amplifier stage. In addition, the improved differential amplifier of the present invention is more responsive to input signal differentials, is less sensitive to the bit line capacitance due to its greater responsiveness, and contributes to reducing the access time of a memory array IC.

In one embodiment of the differential sense amplifier of the present invention, a first amplifying portion with a first amplifying branch and a first reference branch and a second amplifying portion with a second amplifying branch and second reference branch are provided. Further, the differential sense amplifier includes a device for use in causing the first reference signal produced by the first reference branch to be different than the second reference signal produced by the second reference branch. By providing different reference signals to the amplifying branches, greater amplification, increased sensitivity to differential input signal variations, and more rapid response of the differential sense amplifier are attained. Further, the differential sense amplifier responds to smaller differentials in the input signals than would otherwise be possible. Moreover, input signal responsiveness is increased, making the differential sense amplifier less sensitive to bit line capacitance. Additionally, due to the greater gain, the number of amplifier stages can be reduced in some circumstances. All of these features contribute to a decrease in the access time of a memory IC.

In another embodiment of the differential sense amplifier of the present invention, the reference branch of each amplifier portion is cross-connected to the input signal terminal of the other amplifier portion to establish separate reference nodes that provide different reference signals to the amplifying branches. As a result, the input signals to the reference branch and amplifying branch of each amplifier portion are respectively derived from the opposite differentially related amplifier input signals. Consequently, a change in the differential input signal creates opposite changes in the reference signal provided by a reference branch to the amplifying branch with which it is associated and the input signal provided to the amplifying branch with which it is associated for both amplifier portions.

Other embodiments of the differential sense amplifier of the present invention include circuitry for equilibrating the input terminals and equalizing the output terminals to permit the amplifier to be placed in a known state prior to operation.

Yet other embodiments of the differential sense amplifier of the present invention include disabling circuitry to disconnect the amplifier from its power source during periods of non-use to conserve power and latching circuitry to provide the differential output signals that are not dependent upon the continued application of input signals to the amplifier.

A more complete understanding and appreciation of the present invention can be obtained by reference to the accompanying drawings, which are briefly described below, from the following detailed description, and from the appended claims.

DETAILED DESCRIPTION OF THE INVENTION

Figure 4:
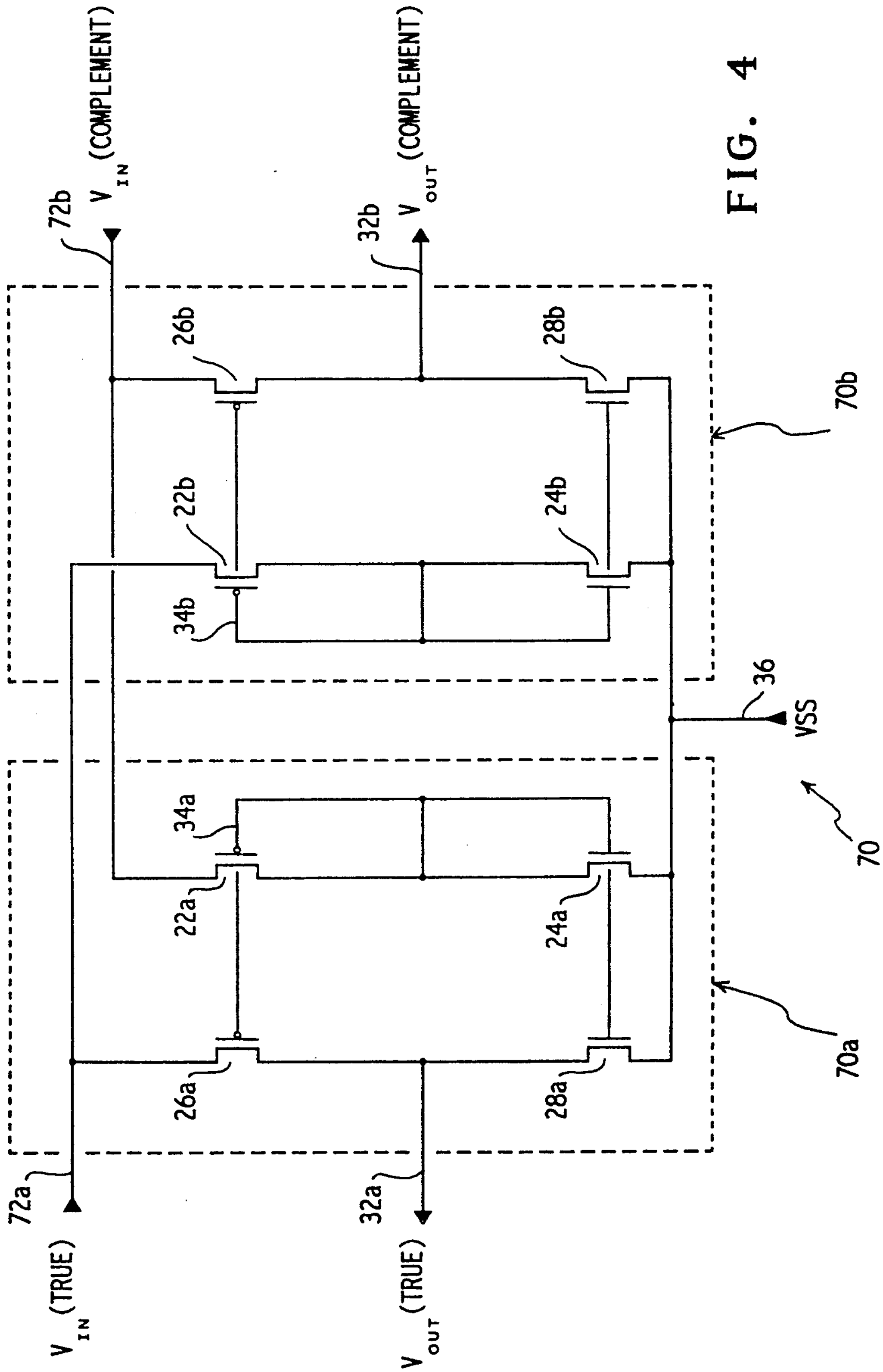
FIG. 4 is a schematic circuit diagram of one embodiment of the differential sense amplifier of the present invention.

One embodiment of the differential sense amplifier 70, hereinafter referred to as sense amplifier 70, of the present invention is illustrated in FIG. 4. With the exceptions described below, the sense amplifier 70 includes the same components previously described in conjunction with the prior art amplifier 20 shown in FIG. 1, and those same components are referenced by the same reference numerals in FIG. 4.

The sense amplifier 70 includes two amplifier portions 70*a* and 70*b*. The amplifier portion 70*a* includes reference branch transistors 22*a* and 24*a*, and amplifying branch transistors 26*a* and 28*a*. The gates and drains of the reference transistors 22*a* and 24*a*, and the gates of the amplifying branch transistors 26*a* and 28*a*, are connected at a reference node 34*a* of the amplifier portion 70*a*. The amplifier portion 70*b* includes reference branch transistors 22*b* and 24*b*, and amplifying branch transistors 26*b* and 28*b*. The gates and drains of the reference transistors 22*b* and 24*b*, and the gates of the amplifying branch transistors 26*b* and 28*b*, are connected at a reference node 34*b* of the amplifier portion 70*b*. The reference nodes 34*a* and 34*b* of the two amplifier portions 70*a* and 70*b* are separate from one another, to allow each amplifier portion 70*a* and 70*b* to establish its own reference signal independently of the reference signal established by the other amplifier portion. The separate amplifier input signals, $V_{in}$ (TRUE) and $V_{in}$ (COMPLEMENT), which form the differential input signal to the sense amplifier 70, are applied at input terminals 72*a* and 72*b*, respectively. The separate output signals, $V_{out}$ (TRUE) and $V_{out}$ (COMPLEMENT), which form the differential output signal from the sense amplifier 70, are supplied at the output terminals 32*a* and 32*b*, respectively.

The input terminal 72*a* is connected to the source terminal of the reference branch transistor 22*b* of the amplifier portion 70*b*, and the input terminal 72*b* is connected to the source terminal of the reference branch transistor 22*a* of the amplifier portion 70*a* to achieve a cross-connection arrangement that results in different reference signals for each amplifier portion. This cross-connection arrangement is one way of supplying an input signal to the amplifier that is present at one input terminal to the reference branch of one amplifier portion and to the amplifying branch of the other amplifier portion. This cross-connection arrangement is also one example of a way for separately connecting each reference branch of one amplifier portion to the amplifying branch of the other amplifier portion.

The reference branch transistors are connected in the self-biased feedback manner, which is one way of establishing a reference signal at the reference node of each amplifying portion. The reference signal at each reference node is related to the magnitude of the amplifier input signal applied across the pair of reference branch transistors. The amplifying branch transistors are connected in one way that amplifies the amplifier input signal applied across the pair of amplifying branch transistors by an amount related to the relative difference between the amplifier input signal and the reference signal provided at its associated reference node.

Figure 1:
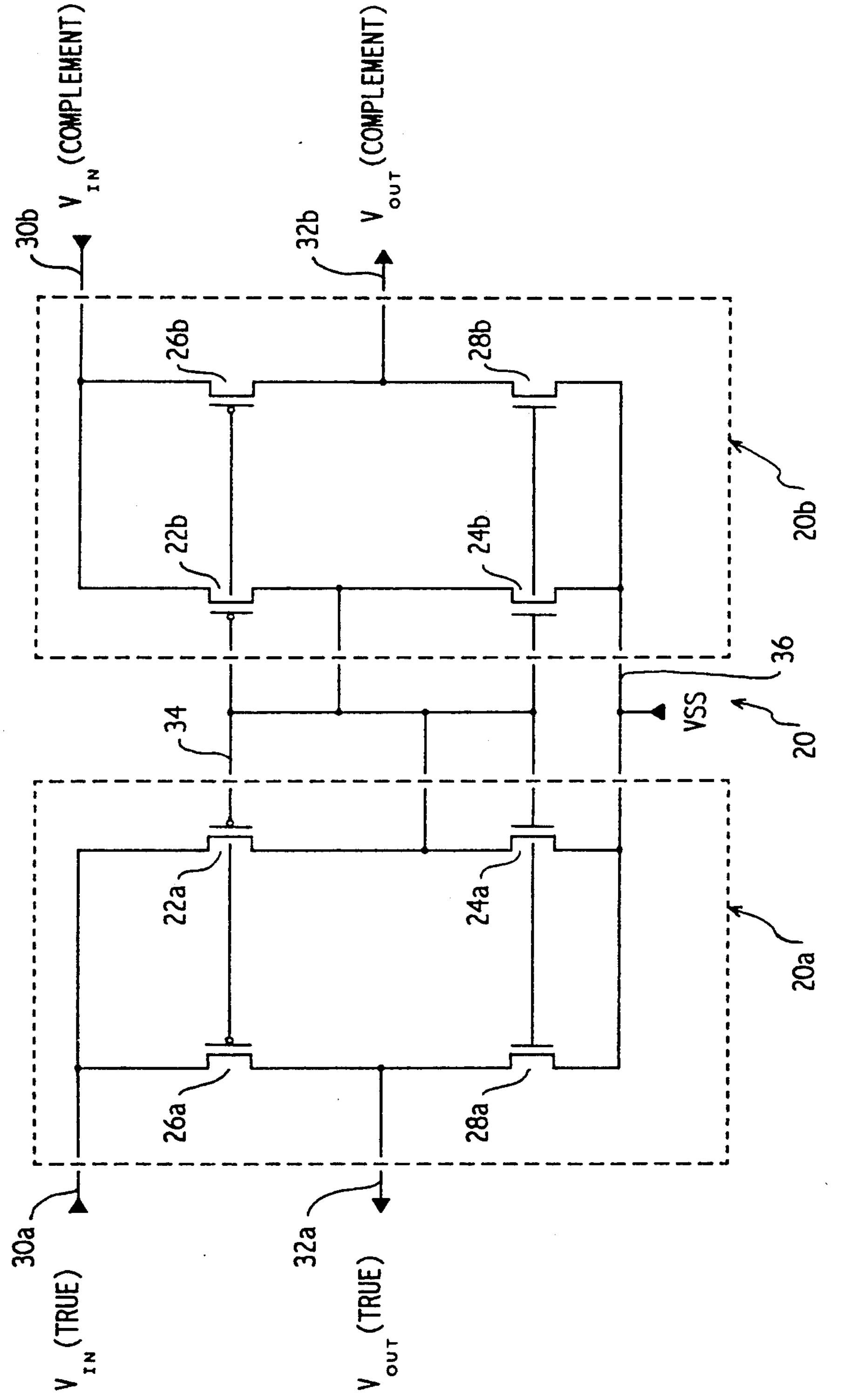
FIG. 1 (PRIOR ART)
FIG. 1 is a schematic circuit diagram of a prior art differential sense amplifier.
Figure 2A:
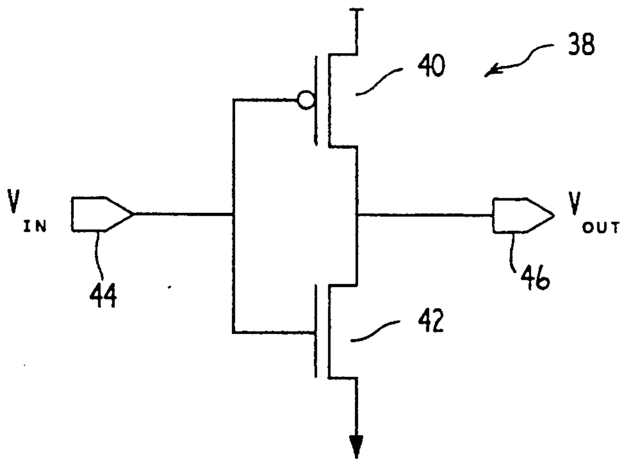
FIG. 2A (PRIOR ART)
FIG. 2A is a schematic circuit diagram of an inverter circuit comprised of a pair of CMOS field-effect transistors.
Figure 2B:
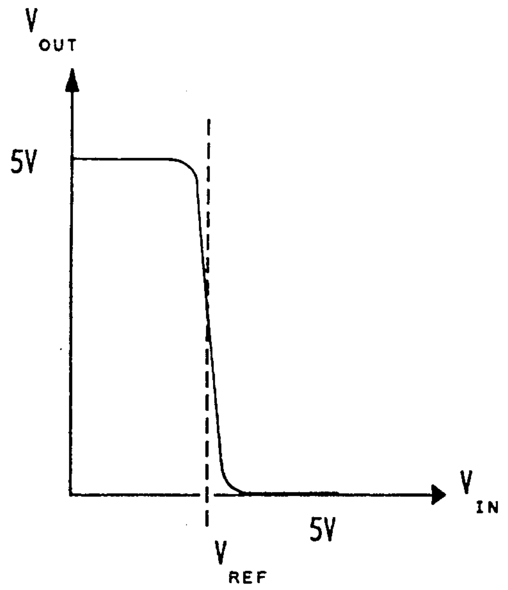
FIG. 2B (PRIOR ART)
FIG. 2B is a graph that illustrates the inverting function of the inverter circuit illustrated in FIG. 2A.
Figure 3A:
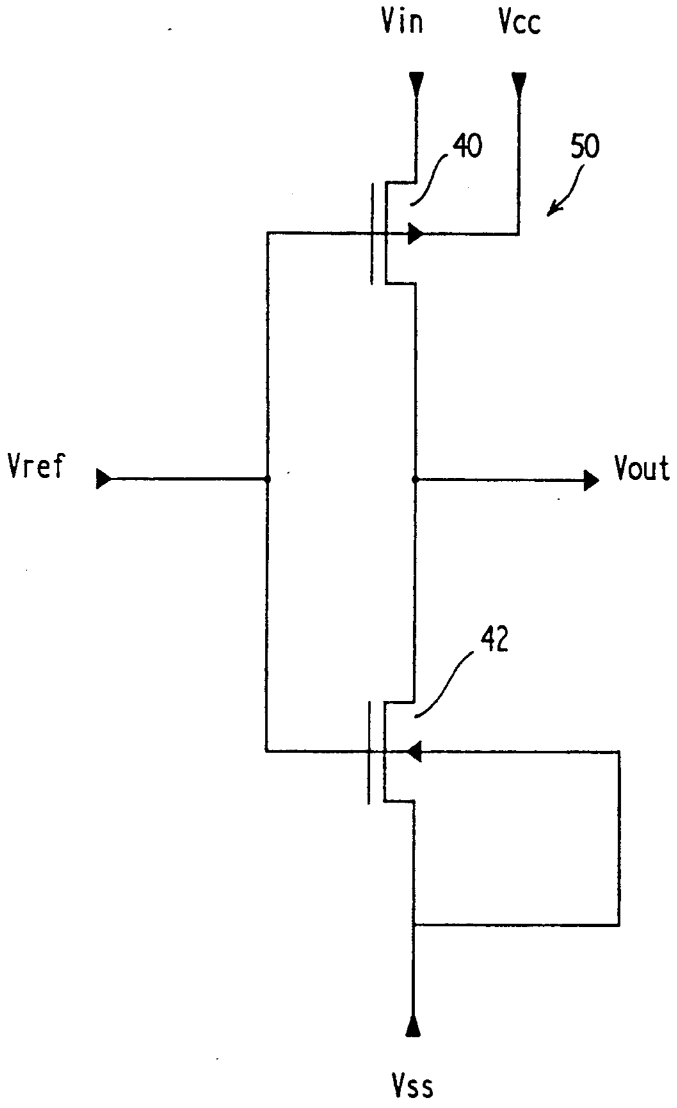
FIG. 3A (PRIOR ART)
FIG. 3A is a schematic circuit diagram of a cascode amplifier circuit comprised of a pair of CMOS field-effect transistors.
Figure 3B:
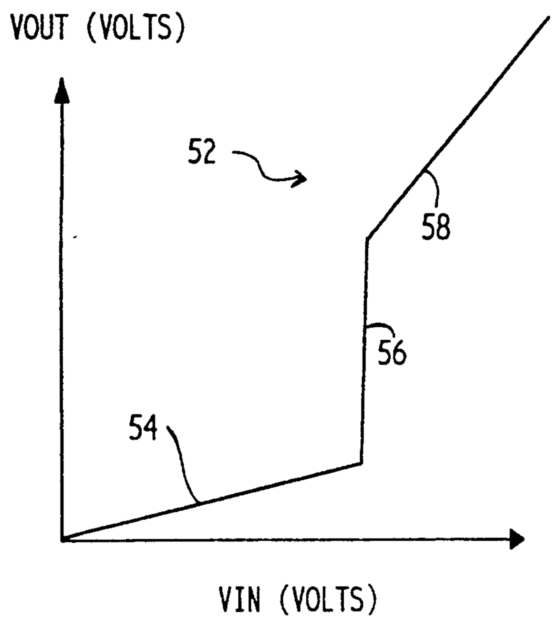
FIG. 3B (PRIOR ART)
FIG. 3B is a graph that illustrates the transfer curve of the cascode amplifier shown in FIG. 3A.
Figure 3C:
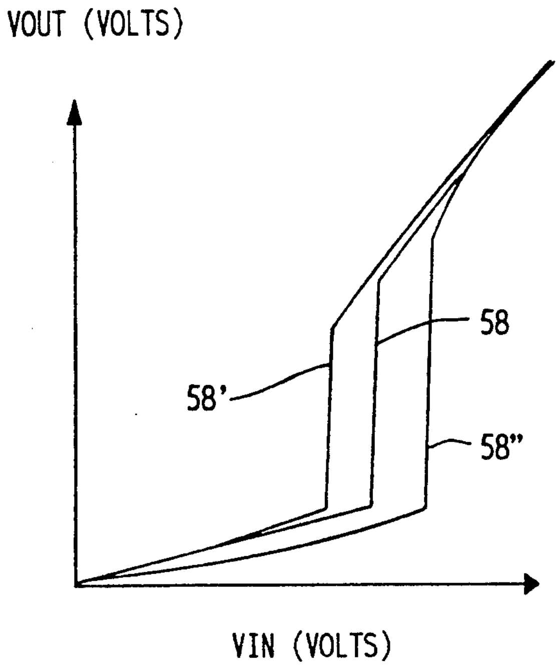
FIG. 3C (PRIOR ART)
FIG. 3C is a graph that illustrates the effect of varying $V_{ref}$ on the transfer curve for the cascode amplifier circuit shown in FIG. 3A.

The changes in the sense amplifier 70 described provide substantial improvements compared to the differential sense amplifier 20 shown in FIG. 1. The significance of these improvements is described below in conjunction with the operation of the sense amplifier 70.

Consider as an example of the operation of the sense amplifier 70, an amplifier input signal at input terminal 72*a* which is slightly higher in voltage than an amplifier input signal at input terminal 72*b*, i.e., the application of a differential signal to the sense amplifier 70. The lower signal at input terminal 72*b* causes the reference transistors 22*a* and 24*a* of the amplifier portion 70*a* to supply a decreased reference signal at node 34*a*. The relatively higher input signal at input terminal 72*a* is applied across the amplifying transistors 26*a* and 28*a*. The higher input signal across the amplifying branch transistors 26*a* and 28*a* and the decreased reference signal supplied by the reference branch transistors 22*a* and 24*a* to the gates of the amplifying transistors 26*a* and 28*a* result in the output signal at output terminal 32*a* increasing more rapidly and to a greater extent.

In the amplifier portion 70*b*, a similar but opposite, effect occurs. The increased input signal at input terminal 72*a* causes the reference transistors 22*b* and 24*b* to supply an increased reference signal at node 34*b*. The increased reference signal together with the decreased input signal applied to the amplifying transistors 26*b* and 28*b* via the input terminal 72*b* causes the output signal at terminal 32 to decrease to a greater degree and faster. Since the relative changes in the applied signal $V_{in}$ and the reference signal $V_{ref}$ in each amplifying portion are opposite of one another, the amount of output signal change for each amplifying portion is greater and faster.

Exactly the same improvements in speed and in gain occur from the application of a differential input signal having relatively opposite potentials compared to the above example, i.e. a lower input signal applied at terminal 72*a* and a higher input signal applied at terminal 72*b*. The greater degree of relative changes in the output level signals occur, but in the opposite directions from those described in the previous example. The relatively faster motions or changes in the output signals at terminals 32*a* and 32*b* result in a significant improvement in responsiveness.

Comparing the sense amplifier 70 shown in FIG. 4 to the prior art amplifier 20 shown in FIG. 1, the same relative change in the amplifier input signals creates a much larger and faster change in the differential output signal. The reference voltage from the reference branch transistors and the relatively opposite changing input signals applied to the amplifying branch transistors creates a situation where each amplifying branch obtains a faster and greater gain in output signal, compared to the situation where the same reference voltage is applied to each amplifying branch as in sense amplifier 20. Thus, decoupling each reference branch from the common node 34 of the differential sense amplifier 20 shown in FIG. 1 and allowing each reference branch to establish its own reference voltage based on the oppositely varying input signal to the other branch, allows the change in reference signal and the change in input signal to both contribute to the amplification and speed of the sense amplifier 70. For a given differential input signal, more sensitivity or responsiveness, and more gain is obtained. The greater gain and/or responsiveness of the sense amplifier 70 decreases the amount of time required to establish an output signal at a predetermined level representative of the logical state of a memory cell in a memory array IC, thereby decreasing the access time. The greater gain and/or responsiveness of the sense amplifier 70 also makes it less sensitive to bit line capacitance, which also improves the access time. The improved gain and/or responsiveness may, in many applications, reduce the number of additional amplifier stages required, which also reduces the access time and reduces the number of components and the space consumed by those components in the memory array IC.

Figure 5:
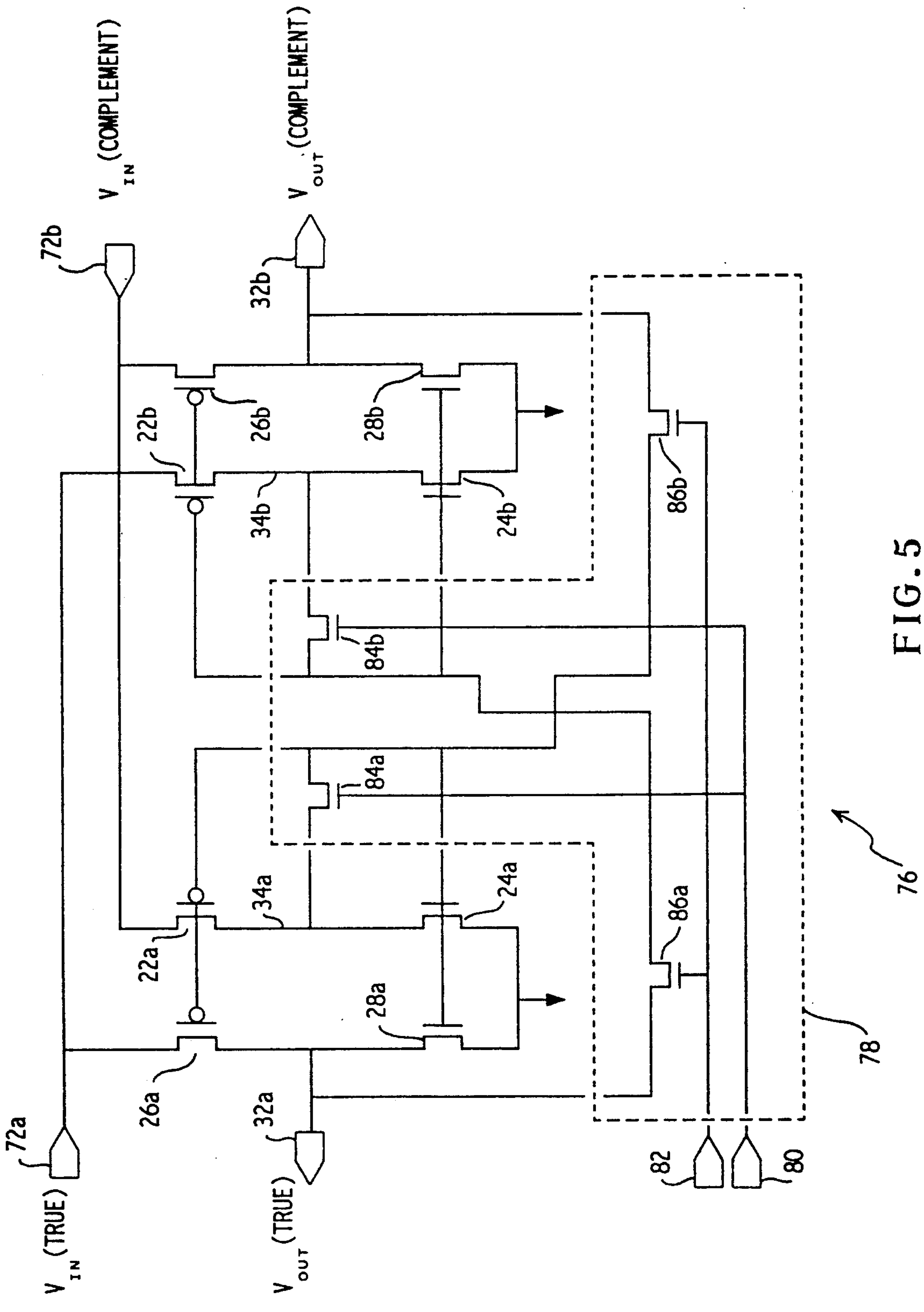
FIG. 5 is a schematic circuit diagram of the differential sense amplifier shown in FIG. 4 with circuitry for latching the output signals provided at the output terminals.

When implemented in a memory array, it is desirable to latch the differential output signals produced by the sense amplifier 70 after the logical state of a memory cell has been sensed so that the differential output signal of the sense amplifier 70 is not dependent upon the continued application of a differential input signal from the addressed memory cell. Additional components are added to the embodiment of the sense amplifier 70 illustrated in FIG. 4 to latch the differential output signal produced by the sense amplifier 70, resulting in the embodiment 76 of the sense amplifier that is shown in FIG. 5. The sense amplifier 76 includes the same components previously described in conjunction with the sense amplifier 70 shown in FIG. 4, and those same common components are referenced by the same reference numerals in FIG. 5. One way to latch the differential output signal produced by the sense amplifier 76 is the latching circuitry 78 that is responsive to first and second latching signals which are provided over first and second latching terminals 80 and 82, respectively. Other types of circuits which latch the differential output signal produced by the sense amplifier 70 in response to one or more latching signals may provide alternatives to the illustrated configuration. For example, a latching circuit based on complementary transfer gates may be feasible.

The latching circuitry 78 includes a first pair of latching FETs 84*a* and 84*b*, which are N-channel devices, and a second pair of latching FETs 86*a* and 86*b*, which are also N-channel devices. The channel of latching FET 84*a* is connected between the gate and drain terminals of FET 22*a* and the gate and drain terminals of FET 24*a*. Similarly, the channel of the latching FET 84*b* is connected between the gate and drain terminals of FET 22*b* and between the gate and drain terminals of FET 24*b*. The gate terminals of the first pair of latching FETs 84*a* and 84*b* are connected to the first latching terminal 80, which is used to provide the first latching signal. The channel of the latching FET 86*a* is connected between the output terminal 32*a* and the gates of the reference FETs 22*b* and 24*b*. Similarly, the channel of the latching FET 86*b* is connected between the output terminal 32*b* and the gates of the reference FETs 22*a* and 24*a*. The gates of the second pair of latching FETs 86*a* and 86*b* are connected to the second latching terminal 82, which is used to provide the second latching signal.

To place the sense amplifier 76 in a condition in which it can sense the state of an addressed memory cell, a high level first latching signal is applied to the first latching terminal 80, and a low level second latching signal is applied to the second latching terminal 82. This application of latching signals places the sense amplifier 76 in an equivalent configuration to the sense amplifier 70 shown in FIG. 4. The high level first latching signal at the first latching terminal 80 places the first pair of latching FETs 84*a* and 84*b* in a saturated or "on" state. Consequently, the gate terminal of the reference FET 22*a* is connected to its drain terminal and the gate of reference FET 24*a* is connected to its drain terminal. Similarly, the gate terminal of the reference FET 22*b* is connected to its drain terminal and the gate terminal of the reference FET 24*b* is connected to its drain terminal. The low level second latching signal applied to the second latching terminal 82 places both of the second pair of latching FETs 86*a* and 86*b* in a non-conductive or "off" state. Consequently, the first output terminal 32*a* is disconnected from the gates of the reference FETs 22*b* and 24*b*. Likewise, the second output terminal 32*b* is disconnected from the gates of the reference FETs 22*a* and 24*a*. In this state, the sense amplifier 76 is functionally identical to the sense amplifier 70 illustrated in FIG. 4 and is therefore capable of sensing the logical state of a memory cell and providing an amplified output signal as described with respect to the sense amplifier 70 illustrated in FIG. 4.

To latch the sense amplifier 76, a low level first latching signal is applied to the first latching terminal 80 and a high level second latching signal is applied to the second latching terminal 82. The low level first latching signal applied to the first latching terminal 80 places the first pair of latching FETs 84*a* and 84*b* in a non-conductive or "off" state to sever the reference branch connections established during the sensing state. The high level second latching signal applied to the second latching terminal 82 places the second pair of latching FETs 86*a* and 86*b* in a saturated or "on" state in which the first output terminal 32*a* is connected to the gate terminals of the reference FETs 22*b* and 24*b*, and the second output terminal 32*b* is connected to the gate terminals of the reference FETs 22*a* and 22*b*. This results in cross-coupled inverter circuits that latch or hold the differential output signal established at the first and second output terminals 32*a* and 32*b* during the sensing state of the sense amplifier 76.

Figure 6:
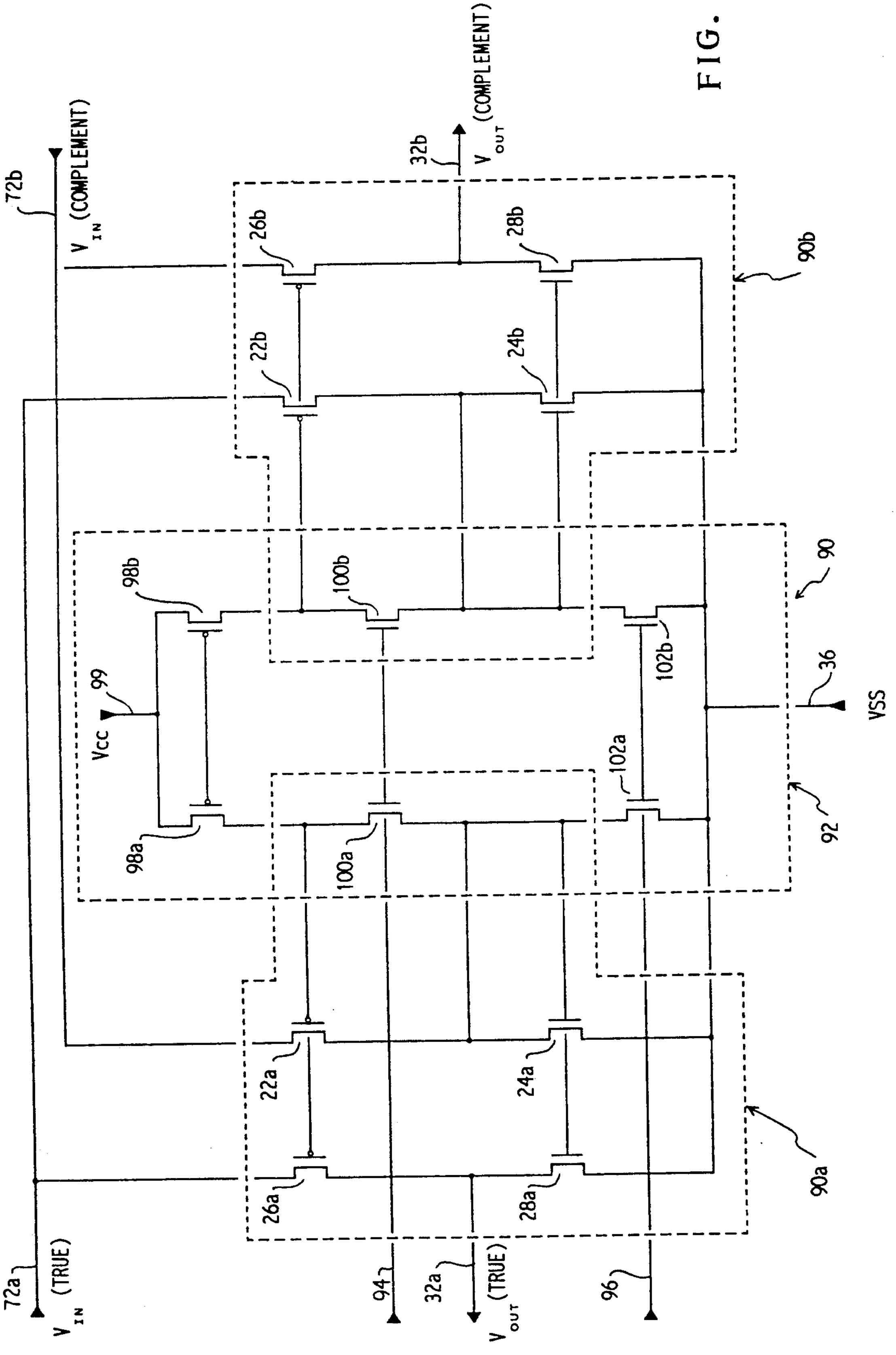
FIG. 6 is a schematic circuit diagram of the differential sense amplifier shown in FIG. 4 with enabling/disabling circuitry.

When implemented in a memory array, it is desirable to disable the sense amplifier 70 illustrated in FIG. 4 when it is not in use to avoid consuming unnecessary current and generating unnecessary heat. Additional components are added to the embodiment of the sense amplifier 70 illustrated in FIG. 4 to enable and disable it, resulting in the embodiment 90 of the sense amplifier that is shown in FIG. 6. The sense amplifier 90 includes the same components previously described in conjunction with the sense amplifier 70 shown in FIG. 4, and those same common components are referenced by the same reference numerals in FIG. 6. One way to enable and disable the sense amplifier 90 is the enable/disable circuit 92 that is responsive to first and second enable/disable signals that are provided over a first and second enable/disable terminals 94 and 96, respectively. Other types of circuits which initiate and terminate the flow of current through the sense amplifier 90 in response to enabling and disabling signals, respectively, may provide alternatives to the configuration shown. Moreover, the sense amplifier 90 is shown as not including the latching circuitry 78 shown in FIG. 5 to simplify the illustration. Consequently, the latching circuitry 78 can be incorporated into the sense amplifier 90 if desired.

The enable/disable circuit 92 includes a first pair of enabling/disabling FETs 98*a* and 98*b*, which are P-channel devices, that have their respective source terminals connected to the power supply $V_{cc}$ at node 99. The enable/disable circuit 92 also includes a second pair of enabling/disabling FETs 100*a* and 100*b*, which are N-channel devices that have their respective drain terminals connected to the corresponding drain terminals of the first pair of enabling/disabling FETs 98*a* and 98*b* and to the corresponding gate terminals of P-channel FETs 22*a*, 26*a*, 22*b*, and 26*b* of the reference and amplifying branches. The first pair of enabling/disabling FETs 98*a* and 98*b*, and the second pair of enabling/disabling FETs 100*a* and 100*b* are both responsive to a first enable/disable signal, which is provided to gate terminals of these FETs via the first enable/disable terminal 94. Also included in the enable/disable circuit 92 is a third pair of enabling/disabling FETs 102*a* and 102*b*, which are N-channel devices that have their respective drain terminals connected to the corresponding source terminals of the second pair of enabling/disabling FETs 100a and 100b, to the corresponding drain terminals of corresponding FETs 22a and 22b, and to the corresponding gate terminals of FETs 24a and 24b. The source terminals of the third pair of enabling/disabling FETs 102a and 102b are connected to reference power supply $V_{ss}$, as are the source terminals of N-channel FETs 24a, 28a, 24b, and 28b. The third pair of enabling-/disabling FETs 102a and 102b are responsive to a second enable/disable signal provided over the second enable/disable terminal 96.

To enable the sense amplifier 90, a high level signal is applied at the first enable/disable terminal 94, and a low level signal is applied at the second enable/disable terminal 96 to place the sense amplifier 90 in an equivalent configuration to the sense amplifier 70 shown in FIG. 4. The high level signal at the first enable/disable terminal 94 places the first pair of enabling/disabling FETs 98a and 98b in a nonconductive or "off" state to disconnect the power supply $V_{cc}$ from the gates of transistors 22a, 26a, 22b, and 26b. In addition, the high level signal at the first enable/disable terminal 94 causes the second pair of enabling/disabling FETs 100a and 100b to be saturated or turned "on" to connect the gates of the transistors 22a and 26a to the reference node of the first amplifying portion and the gates of transistors 22b and 26b to the reference node of the second amplifying portion, respectively. The transistors 102a and 102b are placed in a nonconductive or "off" state upon the application of the low level signal at the second enable/disable terminal 96 to disconnect the reference power supply $V_{ss}$ from the gate terminals of N-channel transistors 24a, 28a, 24b, and 28b.

In the enabled condition, the second pair of enabling-/disabling FETs 100a and 100b are in the saturated or "on" state, and the gates of the reference and amplifying branch transistors of each amplifier portion 90a and 90b are connected to their respective reference nodes. The first and third pair of enabling/disabling FETs 98a and 98b, and 102a and 102b are non-conductive or "off", thereby disconnecting the reference nodes from the power supply $V_{cc}$ and the reference power supply $V_{ss}$, respectively. Thus in the enabled condition, the sense amplifier 90 is in the same functional configuration as shown in FIG. 4 and will function in the same manner as previously described.

To disable the sense amplifier 90, a low level signal is applied to the first enable/disable terminal 94, and a high level signal is applied to the second enable/disable terminal 96. The low level signal at the first enable/disable terminal 94 causes the first pair of enabling/disabling FETs transistors 98a and 98b to be placed in a saturated or "on" state that connects the power supply $V_{cc}$ to the gates of transistors 22a, 26a, 22b, and 26b. Due to the polarity of the voltage signal provided by $V_{cc}$, the transistors 22a, 26a, 22b, and 26b are placed in a non-conductive or "off" state. The low level signal at the first enable/disable terminal 94 also causes the second pair of enabling/disabling FETs 100a and 100b to become non-conductive or turned "off" to disconnect the gates of the transistors 22a and 26a from the reference node of the first amplifying portion and to disconnect the gates of the transistors 22b and 26b from the reference node of the second amplifying portion, respectively. The high level signal at the second enable/disable terminal 96 causes the third pair of enabling-/disabling FETs 102a and 102b to be placed in a saturated or "on" state that connects the reference power supply $V_{ss}$ to the gates of transistors 24a, 28a, 24b, and 28b. Due to the polarity of the voltage signal provided by $V_{ss}$, the transistors 24a, 28a, 24b, and 28b are all placed in non-conductive or "off" state. Thus, all of the transistors of the amplifier portions 90a and 90b are held in a non-conductive state because none of them experience the necessary source to gate threshold voltage to commence conducting. Consequently, no current is conducted between $V_{cc}$ and $V_{ss}$ in this disabled state, and no power is consumed.

Figure 7:
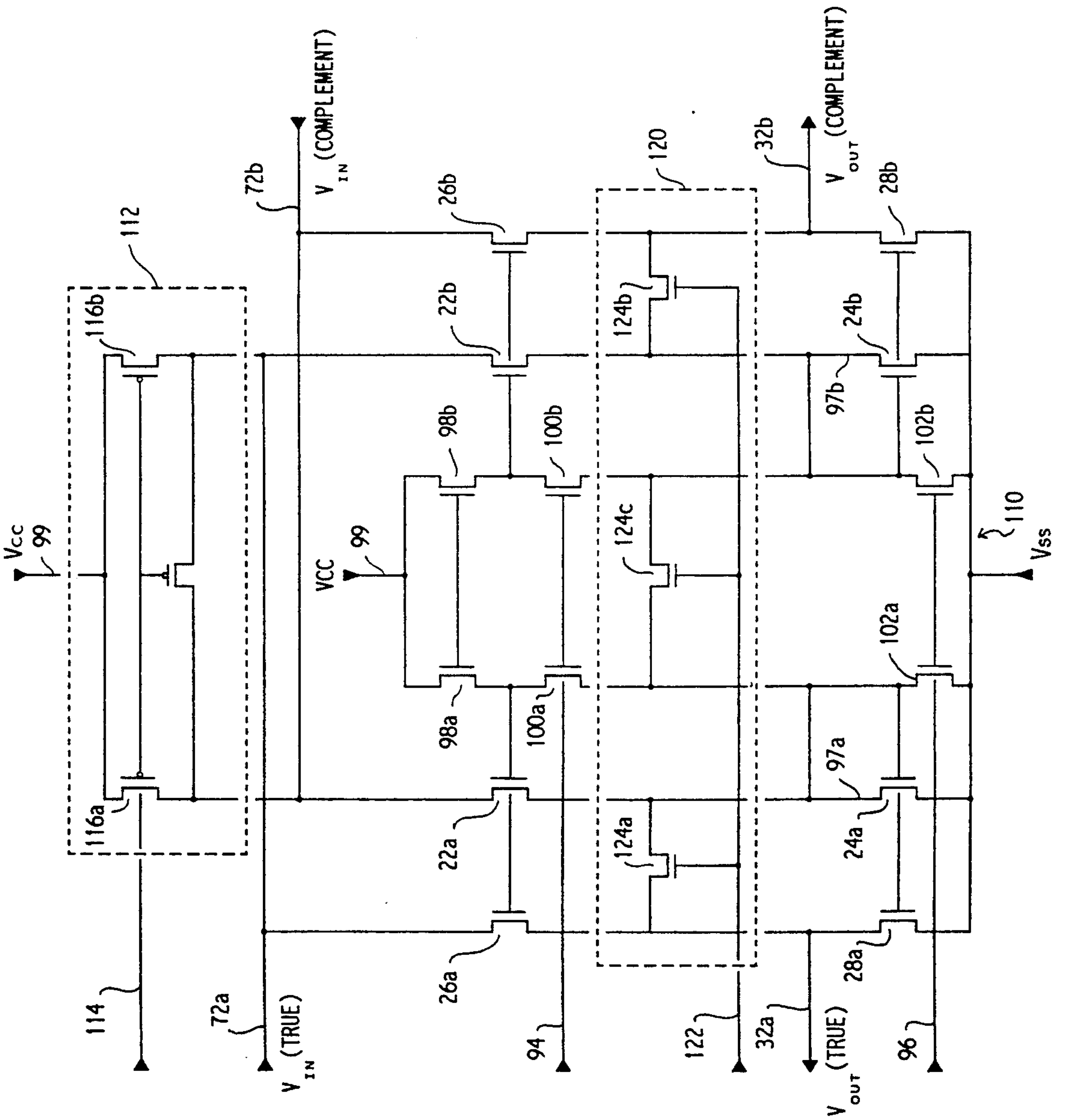
FIG. 7 is a schematic circuit diagram of the differential sense amplifier shown in FIG. 6, with circuitry for equilibrating the input terminals and circuitry for equalizing the output terminals.

To equilibrate the input signals and the reference voltages established by the reference branches prior to sensing and amplifying the signals representative of the logical state of the cell of the memory array, additional components are added to the sense amplifier 90 illustrated in FIG. 6, resulting in the embodiment 110 of the sense amplifier, which is shown in FIG. 7. The sense amplifier 110 includes the same components previously described in conjunction with the sense amplifier 90 shown in FIG. 6, and those components that are common to both are referenced by the same reference numerals in FIG. 7. An equilibration circuit 112 that is responsive to an equilibration signal provided over equilibration terminal 114 is included in the sense amplifier 110 and is one way to equilibrate the input signals at terminals 72a and 72b by shorting them together and connecting them to the power supply $V_{cc}$ at node 99.

The equilibration circuit 112 includes first, second, and third equilibrating FETs 116a, 116b, and 116c that are responsive to the equilibration signal provided to their gates via the equilibration terminal 114. The channels of the equilibrating transistors 116a and 116b are connected between the power supply $V_{cc}$ and the input terminals 72b and 72a, respectively. The channel of equilibrating transistor 116c is connected between input terminals 72a and 72b. The gates of the first, second, and third FETs 116a, 116b, and 116c are connected to the equilibration terminal 114, which is used to provide the equilibration signal.

Equilibrating the input signals occurs by applying a low level equilibration signal to the equilibration terminal 114. In response, the transistors 116a, 116b, and 116c are all placed in a saturated or "on" state. Since the channel of the transistor 116c is connected between the input terminals 72a and 72b, the placement of the equilibrating transistor 116c in a saturated or "on" state results in the input signal terminals 72a and 72b being shorted together. Further, since the channels of transistors 116a and 116b are respectively connected between the power supply $V_{cc}$ and the input terminals 72b and 72a, the placement of the equilibrating transistors 116a and 116b in the saturated or "on" state connects both the input terminals 72a and 72b to $V_{cc}$ at node 99 to establish the same voltage signal at each input terminal 72a and 72b.

An equalization circuit 120 that is responsive to an equalization signal provided over an equalization terminal 122 is also included in the sense amplifier 110 for equalizing the signals on the output terminals 32a and 32b, which also assists in obtaining a neutral state in the sense amplifier 110 prior to the sensing and amplifying of the input signals representative of the logical state of memory cell. The equalization circuit 120 includes three equalizing transistors 124a, 124b and 124c that are responsive to an equalization signal provided to the gates of these transistors via equalization terminal 122. The channel of the equalizing transistor 124a connects the output terminal 32a and the reference node of the first amplifying portion. Similarly, the channel of the equalizing transistor 124*b* is connected between the output terminal 32*b* and the reference node of the second amplifying portion. The channel of the equalizing transistor 124*c* is connected between reference nodes of the first and second amplifying portions.

Equalizing the output terminals 32*a* and 32*b* occurs upon application of a high level equalizing signal to the equalizing terminal 122. The high equalizing signal causes the first, second, and third equalizing transistors 124*a*, 124*b* and 124*c* to be placed in a saturated or "on" state. As a result, the first equalizing transistor 124*a* connects the output terminal 32*a* and the reference node of the first amplifying portion; the second equalizing transistor 124*b* connects the output terminal 32*b* and the reference node of the second amplifying portion; and the third equalizing transistor 124*c* shorts together both reference nodes of the first and second amplifying portions. With these connections, an equalized condition occurs in which both output terminals 32*a* and 32*b* are shorted together through the shorted-together reference nodes of the first and second amplifying portions.

In the equilibrated and equalized condition, the input terminals 72*a* and 72*b* are shorted together and connected to the power source $V_{cc}$ at node 99, and the output terminals are shorted through the shorted-together reference nodes of the first and second amplifying portions. The sense amplifier 110 is thereby conditioned to respond effectively and rapidly to the differential input signals appearing on the bit lines from the memory cell as soon as the equilibrating and equalizing signals are released, thereafter allowing the sense amplifier 110 to function as described with respect to the sense amplifier 70 illustrated in FIG. 4.

Equilibration and equalization of the sense amplifier 110 can be accomplished while the sense amplifier 110 is enabled or disabled. If the amplifier is disabled, equilibrated, and equalized all at the same time, the disabling transistors 102*a* and 102*b* will be conductive and the equalization transistors 124*a*, 124*b* and 124*c* will be conductive, thereby shorting the output terminals 32*a* and 32*b* to the reference potential $V_{ss}$ at node 36.

Additionally, the sense amplifier 110 is shown as not including the latching circuitry 78 shown in FIG. 5. This has been done merely to simplify the illustration of the sense amplifier 110. Consequently, if desired, the latching circuitry 78 can be incorporated into the sense amplifier 110.

In terms of signal timing, if the sense amplifier 110 is first disabled, it should be enabled prior to terminating the equilibration and equalization signals at the equilibration terminal 114 and the equalization terminal 122, respectively. If the sense amplifier 11? is equilibrated and equalized while it is enabled, the equilibration and equalization signals at terminals 114 and 122 should be of sufficient duration so that there is no voltage difference between the reference nodes of the first and second amplifying portions and the output terminals 32*a* and 32*b* before the equilibration and equalization signals at the equilibration terminal 114 and the equalization terminal 122, respectively, are terminated.

Means for applying the various signals to the described terminals of the sense amplifier embodiments have not been shown, but the sources for, and timing of, those signals is known or apparent to those having knowledge of sense amplifiers and memory array ICs.

The present invention has been shown and described with reference to input signals applied to the sources of P-channel transistors and the sources of the N-channel transistors connected to the reference power supply ($V_{ss}$). The complementary analog of this sense amplifier circuit can be implemented with the input signal applied to the sources of the N-channel transistors and the P-channel sources connected to the power supply ($V_{cc}$) using well known conversion techniques. Moreover, the invention can be applied to differential sense amplifiers that use other types of transistors, such as bipolar transistors.

The foregoing description of the invention has been presented for purposes of illustration and description. Further, the description is not intended to limit the invention to the form disclosed herein. Consequently, variations and modifications commensurate with the above teachings, and the skill or knowledge in the relevant art are within the scope of the present invention. The preferred embodiment described herein above is further intended to explain the best mode known of practicing the invention and to enable others skilled in the art to utilize the invention in various embodiments and with various modifications required by their particular applications or uses of the invention. It is intended that the appended claims be construed to include alternate embodiments to the extent permitted by the prior art.

What is claimed is:

1. A differential sense amplifier receptive of a differential input signal that is defined by a first input signal and a second input signal which is different than the first input signal, and for supplying an amplified differential output signal that is defined by a first output signal and a second output signal which is different than the first output signal, comprising:

a first amplifying portion that includes a first input terminal for receiving the first input signal, a first reference branch for providing a first reference signal at a first reference node, a first amplifying branch that uses said first reference signal in amplifying the first input signal to produce the first output signal, and a first output terminal for outputting the first output signal provided by said first amplifying branch, wherein said first amplifying branch includes a first upper transistor and a first lower transistor, said first output terminal is located between and operatively connected to said first upper transistor and said first lower transistor, and said first reference node provides said first reference signal to both said first upper transistor and said first lower transistor;

a second amplifying portion that includes a second input terminal for receiving the second input signal, a second reference branch for providing a second reference signal at a second reference node, a second amplifying branch that uses said second reference signal in amplifying the second input signal to produce the second output signal, and a second output terminal for outputting the second output signal provided by said second amplifying branch, wherein said second amplifying branch includes a second upper transistor and a second lower transistor, said second output terminal is located between and operatively connected to said second upper transistor and said second lower transistor, and said second reference node provides said second reference signal to both said second upper transistor and said second lower transistor; and means for use in causing said first reference signal to be different than said second reference signal to increase the gain of the differential sense amplifier.

2. A differential sense amplifier, as claimed in claim 1, wherein:

said first reference signal produced by said first reference branch changes in magnitude oppositely to a change in magnitude of the first input signal.

3. A differential sense amplifier, as claimed in claim 1, wherein:

said first reference signal produced by said first reference branch changes in magnitude oppositely to a change in magnitude of the first input signal and said second reference signal produced by said second reference branch changes in magnitude oppositely to a change in magnitude of the second input signal.

4. A differential sense amplifier, as claimed in claim 1, wherein:

said means for use in causing said first reference signal to be different than said second reference signal includes means for providing the first input signal to said second amplifying portion and the second input signal to said first amplifying portion.

5. A differential sense amplifier, as claimed in claim 1, wherein:

said means for use in causing said first reference signal to be different than said second reference signal includes means for providing the first input signal to said second reference branch and the second input signal to said first reference branch.

6. A differential sense amplifier, as claimed in claim 1, wherein:

said first reference node is separate from said second reference node.

7. A differential sense amplifier, as claimed in claim 1, wherein:

said first reference branch includes a first upper transistor and a first lower transistor.

8. A differential sense amplifier, as claimed in claim 1, wherein:

said first reference branch includes a first n-channel FET and a first p-channel FET wherein gates and drains of both said first n-channel FET and first p-channel FET are all operatively connected to one another.

9. A differential sense amplifier, as claimed in claim 1, wherein:

at least one of said first upper transistor and said first lower transistor includes a CMOS transistor.

10. A differential sense amplifier, as claimed in claim 1, wherein:

said first upper transistor and said first lower transistor each includes a CMOS transistor.

11. A differential sense amplifier, as claimed in claim 1, wherein:

said first upper transistor includes one of a p-channel CMOS transistor and an n-channel CMOS transistor, and said first lower transistor includes an n-channel CMOS transistor if said first upper transistor includes a p-channel CMOS transistor, and a p-channel CMOS transistor if said first upper transistor includes an n-channel CMOS transistor.

12. A differential sense amplifier, as claimed in claim 1, wherein:

said first upper transistor includes a first type of transistor and said first lower transistor includes a second type of transistor that is complementary to said first type of transistor.

13. A differential sense amplifier, as claimed in claim 1, wherein:

said first amplifying portion and said second amplifying portion substantially avoid the use bias resistors.

14. A differential sense amplifier, as claimed in claim 1, wherein:

said first amplifying portion and said second amplifying portion substantially avoid the use of capacitors.

15. A differential sense amplifier receptive of a differential input signal that is defined by a first input signal and a second input signal which is different than the first input signal, and for supplying an amplified differential output signal that is defined by a first output signal and a second output signal which is different than the first output signal, comprising:

a first amplifying portion that includes a first input terminal for receiving the first input signal, a first reference branch for providing a first reference signal at a first reference node, a first amplifying branch that uses said first reference signal in amplifying the first input signal to produce the first output signal, and a first output terminal for outputting the first output signal provided by said first amplifying branch;

a second amplifying portion that includes a second input terminal for receiving the second input signal, a second reference branch for providing a second reference signal at a second reference node, a second amplifying branch that uses said second reference signal in amplifying the second input signal to produce the second output signal, and a second output terminal for outputting the second output signal provided by said second amplifying branch;

means for use in causing said first reference signal to be different than said second reference signal to increase the gain of the differential sense amplifier; and means for selectively latching said first and second output signals.

16. A differential sense amplifier, as claimed in claim 1, further comprising:

means for selectively disabling said first and second amplifying portions to prevent said first and second amplifying portions from conducting current from a power supply.

17. A differential sense amplifier receptive of a differential input signal that is defined by a first input signal and a second input signal which is different than the first input signal, and for supplying an amplified differential output signal that is defined by a first output signal and a second output signal which is different than the first output signal, comprising:

a first amplifying portion that includes a first input terminal for receiving the first input signal, a first reference branch for providing a first reference signal at a first reference node, a first amplifying branch that uses said first reference signal in amplifying the first input signal to produce the first output signal, and a first output terminal for outputting the first output signal provided by said first amplifying branch;

a second amplifying portion that includes a second input terminal for receiving the second input signal, a second reference branch for providing a second reference signal at a second reference node, a second amplifying branch that uses said second reference signal in amplifying the second input signal to produce the second output signal, and a second output terminal for outputting the second output signal provided by said second amplifying branch;

means for use in causing said first reference signal to be different than said second reference signal to increase the gain of the differential sense amplifier; and means for selectively equilibrating said first and second input terminals, wherein a common potential is applied to said first and second input terminals when said means for selectively equilibrating is selected.

18. A differential sense amplifier receptive of a differential input signal that is defined by a first input signal and a second input signal which is different than the first input signal, and for supplying an amplified differential output signal that is defined by a first output signal and a second output signal which is different than the first output signal, comprising:

a first amplifying portion that includes a first input terminal for receiving the first input signal, a first reference branch for providing a first reference signal at a first reference node, a first amplifying branch that uses said first reference signal in amplifying the first input signal to produce the first output signal, and a first output terminal for outputting the first output signal provided by said first amplifying branch;

a second amplifying portion that includes a second input terminal for receiving the second input signal, a second reference branch for providing a second reference signal at a second reference node, a second amplifying branch that uses said second reference signal in amplifying the second input signal to produce the second output signal, and a second output terminal for outputting the second output signal provided by said second amplifying branch;

means for use in causing said first reference signal to be different than said second reference signal to increase the gain of the differential sense amplifier; and means for selectively equalizing said first and second output terminals, wherein a common potential is applied to said first and second output terminals when said means for selectively equalizing is selected.

19. A differential sense amplifier receptive of a differential input signal that is defined by a first input signal and a second input signal which is different than the first input signal, and for supplying an amplified differential output signal that is defined by a first output signal and a second output signal which is different than the first output signal, comprising:

a first amplifying portion that includes a first input terminal for receiving the first input signal, a first reference branch for providing a first reference signal at a first reference node, a first amplifying branch that uses said first reference signal in amplifying the first input signal to produce the first output signal, and a first output terminal for outputting the first output signal provided by said first amplifying branch;

a second amplifying portion that includes a second input terminal for receiving the second input signal, a second reference branch for providing a second reference signal at a second reference node, a second amplifying branch that uses said second reference signal in amplifying the second input signal to produce the second output signal, and a second output terminal for outputting the second output signal provided by said second amplifying branch;

means for use in causing said first reference signal to be different than said second reference signal to increase the gain of the differential sense amplifier; and means for selectively equalizing said first and second output terminals that includes means for substantially connecting said first output terminal to said first reference node, and said second output terminal to said second reference node, wherein a common potential is applied to said first and second output terminals and said first and second reference nodes when said means for selectively equalizing is selected.

20. A differential sense amplifier receptive of a differential input signal that is defined by a first input signal and a second input signal which is different than the first input signal, and for supplying an amplified differential output signal that is defined by a first output signal and a second output signal which is different than the first output signal, comprising:

a first amplifying portion that includes a first input terminal for receiving the first input signal, a first reference branch for providing a first reference signal at a first reference node, a first amplifying branch that uses said first reference signal in amplifying the first input signal to produce the first output signal, and a first output terminal for outputting the first output signal provided by said first amplifying branch;

a second amplifying portion that includes a second input terminal for receiving the second input signal, a second reference branch for providing a second reference signal at a second reference node, a second amplifying branch that uses said second reference signal in amplifying the second input signal to produce the second output signal, and a second output terminal for outputting the second output signal provided by said second amplifying branch;

means for use in causing said first reference signal to be different than said second reference signal to increase the gain of the differential sense amplifier; and means for selectively equalizing said first output terminal and said second output terminal that includes means for substantially connecting said first reference node to said second reference node, wherein a common potential is applied to said first and second reference nodes when said means for selectively equalizing is selected.

21. A differential sense amplifier receptive of a differential input signal that is defined by a first input signal and a second input signal which is different than the first input signal, and for supplying an amplified differential output signal that is defined by a first output signal and a second output signal which is different than the first output signal, comprising:

a first amplifying portion that includes a first input terminal for receiving the first input signal, a first reference branch for providing a first reference signal at a first reference node, a first amplifying branch that uses said first reference signal in amplifying the first input signal to produce the first output signal, and a first output terminal for outputting the first output signal provided by said first amplifying branch;

a second amplifying portion that includes a second input terminal for receiving the second input signal, a second reference branch for providing a second reference signal at a second reference node, a second amplifying branch that uses said second reference signal in amplifying the second input signal to produce the second output signal, and a second output terminal for outputting the second output signal provided by said second amplifying branch;

means for use in causing said first reference signal to be different than said second reference signal to increase the gain of the differential sense amplifier; and means for selectively equalizing said first output terminal and said second output terminal, that includes means for connecting said first output terminal, said first reference node, said second output terminal, and said second reference node, wherein as common potential is applied to said first output terminal, said first reference node, said second output terminal, and said second reference node when said means for selectively equalizing is selected.

22. A differential sense amplifier receptive of a differential input signal that is defined by a first input signal and a second input signal which is different than the first input signal, and for supplying an amplified differential output signal that is defined by a first output signal and a second output signal which is different than the first output signal, comprising:

a first reference branch that includes a first pair of reference field-effect transistors (FETs), a one of a first type and an other of a second type, each of said first pair of reference FETs includes a first reference FET gate terminal, a first reference FET drain terminal, and a first reference FET source terminal, wherein said first reference FET drain terminal of said one of said first pair of reference FETs is operatively connected, by a first connection of said first reference branch, to said first reference drain terminal of said other of said first pair of reference FETs and, by a second connection of said first reference branch, to both of said first reference FET gate terminals, and the source terminal of said other of said first pair of reference FETs is operatively connected to a first reference potential;

a first amplifier branch that includes a first pair of amplifier FETs, a one of said first type and an other of said second type, each of said first pair of amplifier FETs includes a first amplifier FET gate terminal, a first amplifier FET drain terminal, and a first amplifier FET source terminal, wherein said first amplifier source terminal of said one of said first pair of amplifier FETs is operatively connected to a first input terminal for receiving the first input signal, said first amplifier drain terminal of said one of said first pair of amplifier FETs is operatively connected to said first amplifier drain terminal of said other of said first pair of amplifier FETs to define a first output terminal for providing the first output signal, said first amplifier source terminal of said other of said first pair of amplifier FETs is operatively connected to said first reference potential, said first amplifier FET gate terminal of said one of said first pair of amplifier FETs is operatively connected to said first reference FET gate terminal of said one of said first pair of reference FETs, and said first amplifier FET gate terminal of said other of said first pair of amplifier FETs is operatively connected to said first reference FET gate terminal of said other of said first pair of reference FETs;

a second reference branch that includes a second pair of reference FETs, a one of said first type and an other of said second type, each of said second pair of reference FETs includes a second reference FET gate terminal, a second reference FET drain terminal, and a second reference FET source terminal, wherein said second reference FET drain terminal of said one of said second pair of reference FETs is operatively connected, by a first connection of said second reference branch, to said second reference FET drain terminal of said other of said second pair of reference FETs and, by a second connection of said second reference branch, to both of said second reference FET gate terminals, and the source terminal of said other of said second pair of reference FETs is operatively connected to said first reference potential; and a second amplifier branch that includes a second pair of amplifier FETs, a one of said first type and an other of said second type, each of said second pair of amplifier FETs includes a second amplifier FET gate terminal, a second amplifier FET drain terminal, and a second amplifier FET source terminal, wherein said second amplifier source terminal of said one of said second pair of amplifier FETs is operatively connected to a second input terminal for receiving the second input signal, said second amplifier drain terminal of said one of said second pair of amplifier FETs is operatively connected to said second amplifier drain terminal of said other of said second pair of amplifier FETs to define a second output terminal for providing the second output signal, said second amplifier source terminal of said other of said second pair of amplifier FETs is operatively connected to said first reference potential, said second amplifier FET gate terminal of said one of said second pair of amplifier FETs is operatively connected to said second reference FET gate terminal of said one of said second pair of reference FETs, and said second amplifier FET gate terminal of said other of said second pair of amplifier FETs is operatively connected to said second reference FET gate terminal of said other of said second pair of reference FETs;

wherein said first reference FET source terminal of said one of said first pair of reference FETs is operatively connected to said second input terminal and said second reference FET source terminal of said one of said second pair of reference FETs is operatively connected to said first input terminal.

23. A differential source amplifier, as claimed in claim 22, further including:

a latching circuit that includes:

a first pair of latching FETs, a one of said first type and an other of said first type, each of said first pair of latching FETs includes a first latching FET gate terminal, a first latching FET drain terminal, and a first latching FET source terminal;

a second pair of latching FETs, a one of said first type and an other of said first type, each of said second pair of latching FETs includes a second latching FET gate terminal, a second latching FET drain terminal, and a second latching FET source terminal;

wherein said first latching FET drain terminal of said one of said first pair of latching FETs is operatively connected to both of said first reference FET gate terminals;

wherein said first latching FET source terminal of said one of said first pair of latching FETs is operatively connected to both of said first reference FET drain terminals;

wherein said first latching FET gate terminal of said one of said first pair of latching FETs is operatively connected to a first latching terminal that is used to provide a first latching signal;

wherein said first latching FET drain terminal of said other of said first pair of latching FETs is operatively connected to both of said second reference FET gate terminals;

wherein said first latching FET source terminal of said other of said first pair of latching FETs is operatively connected to said first output terminal;

wherein said first latching FET gate terminal of said other of said first pair of latching FETs is operatively connected to a second latching terminal that is used to provide a second latching signal;

wherein said second latching FET drain terminal of said one of said second pair of latching FETs is operatively connected to both of said second reference FET gate terminals;

wherein said second latching FET source terminal of said one of said second pair of latching FETs is operatively connected to both of said second reference FET drain terminals;

wherein said second latching FET gate terminal of said one of said first pair of latching FETs is operatively connected to said first latching terminal that is used to provide said first latching signal;

wherein said second latching FET drain terminal of said other of said second pair of latching FETs is operatively connected to both of said first reference FET gate terminals;

wherein said second latching FET source terminal of said other of said second pair of latching FETs is operatively connected to said second output terminal;

wherein said second latching FET gate terminal of said other of said second pair of latching FETs is operatively connected to said second latching terminal that is used to provide said second latching signal; and wherein said first pair of latching FETs and said second pair or latching FETs cooperate to latch said first output signal and said second output signal when said first latching signal is applied to said first latching terminal and said second latching signal is applied to said second latching terminal, and unlatch said first output signal and said second output signal when said first latching signal is removed from said second latching terminal, wherein said one of said first pair of latching FETs cooperates to establish said second connection of said first reference branch and said one of said second pair of latching FETs cooperates to establish said second connection of said second reference branch upon application of said first latching signal to said first latching terminal.

24. A differential sense amplifier, as claimed in claim 22, further including;

an enable/disable circuit that includes:

a first pair of enabling/disabling FETs, a one of said first type and an other of said first type, each of said first pair of enabling/disabling FETs includes a first enable/disable FET gate terminal, a first enable/disable FET drain terminal, and a first enable/-disable FET source terminal;

a second pair of enabling/disabling FETs, a one of said second type and an other of said second type, each of said second pair of enabling/disabling FETs includes a second enable/disable FET gate terminal, a second enable/disable FET drain terminal, and a second enable/disable FET source terminal;

a third pair of enable/disable FETs, one of said second type and an other of said second type, each of said third pair of enable/disable FETs includes a third enable/disable FET gate terminal, a third enable/disable FET drain terminal, and a third enable/disable FET source terminal;

wherein both of said first enable/disable FET source terminals are operatively connected to a second source of reference potential;

wherein said first enable/disable FET drain terminal of said one of said first pair of enabling/disabling FETs is operatively connected to said second enable/disable FET drain terminal of said one of said second pair of enabling/disabling FETs and to said first reference FET gate terminal of said one of said first pair of reference FETs;

wherein said first enable/disable FET drain terminal of said other of said first pair of enabling/disabling FETs is operatively connected to said second enable/disable FET drain terminal of said other of said second pair of enabling/disabling FETs and to said second reference FET gate terminal of said one of said second pair of reference FETs;

wherein both of said first enable/disable FET gate terminals are operatively connected to both of said second enable/disable FET gate terminals and to a first enable/disable terminal that is used to provide a first enable/disable signal;

wherein said second enable/disable FET source terminal of said one of said second pair of enabling-/disabling FETs is operatively connected to said third enable/disable FET drain terminal of said one of said third pair of enabling/disabling FETs and to both of said first reference FET drain terminals of said first pair of reference FETs;

wherein said second enable/disable FET source terminal of said other of said second pair of enabling-/disabling FETs is operatively connected to said third enable/disable FET drain terminal of said other of said third pair of enabling/disabling FETs and to both of said second reference FET drain terminals of said second pair of reference FETs;

wherein both of said third enable/disable FET source terminals are operatively connected to said first reference potential;

wherein both of said third enable/disable FET gate terminals are operatively connected to a second enable/disable terminal that is used to provide a second enable/disable signal;

wherein said first, second and third pair of enable/disable FETs operatively disconnect said first and second reference and amplifier branches from a power source when said first enable/disable signal is applied to said first enable/disable terminal and said second enable/disable signal is applied to said second enable/disable terminal, and operatively connect said first and second reference and amplifier branches to said power source when said first enable/disable signal is removed from said first enable/disable terminal and said second enable/disable signal is removed from said second enable/disable terminal, wherein said one of said second pair of enabling/disabling FETs cooperates to establish said first connection of said first reference branch and said other of said second pair of enabling/disabling FETs cooperates to establish said first connection of said second reference branch upon application of said first enable/disable signal to said first enable/disable terminal.

25. A differential source amplifier, as claimed in claim 22, further including:

an equilibration circuit that includes:

a first equilibration FET that has a first equilibration FET gate terminal, a first equilibration FET drain terminal, and a first equilibration FET source terminal;

a second equilibration FET that includes a second equilibration FET gate terminal, a second equilibration FET drain terminal, and a second equilibration FET source terminal; and a third equilibration FET that includes a third equilibration FET gate terminal, a third equilibration FET drain terminal, and a third equilibration FET source terminal;

wherein said first equilibration FET source terminal and said second equilibration FET source terminal are operatively connected to a second reference potential;

wherein said first equilibration FET drain terminal is operatively connected to said third equilibration FET source terminal and said second input terminal;

wherein said second equilibration FET drain terminal is operatively connected to said third equilibration FET drain terminal and said first input terminal;

wherein said first equilibration FET gate terminal, said second equilibration FET gate terminal, and said third equilibration FET gate terminal are operatively connected to an equilibration terminal that is used to provide an equilibration signal;

wherein said first, second and third equilibration FETs operatively connect said first and second input terminals to said second reference potential when said equilibration signal is applied to said equilibration terminal and operatively disconnect said first and second input terminals from said second reference potential when said equilibration signal is removed from said equilibration terminal.

26. A differential sense amplifier, as claimed in claim 22, further comprising:

an equalization circuit that includes a first equalization FET that has a first equalization FET gate terminal, a first equalization FET drain terminal, and a first FET equalization source terminal;

a second equalization FET that includes a second equalization FET gate terminal, a second equalization FET drain terminal, and a second FET equalization source terminal; and a third equalization FET that includes a third equalization FET gate terminal, a third equalization FET drain terminal, and a third FET equalization source terminal;

wherein said first equalization FET drain terminal is operatively connected to both of said first reference FET drain terminals;

wherein said first equalization FET source terminal is operatively connected to said first output terminal;

wherein said second equalization FET drain terminal is operatively connected to both of said second reference FET drain terminals;

wherein said second equalization FET source terminal is operatively connected to said second output terminal;

wherein said third equalization FET drain terminal is operatively connected to both of said first reference FET drain terminals;

wherein said third equalization FET source terminal is operatively connected to both of said second reference FET drain terminals;

wherein said first equalization FET gate terminal, said second equalization FET gate terminal, and said third equalization FET gate terminal are operatively connected to an equalization terminal that is used to provide an equalization signal; and wherein said first, second, and third equalization FETs operatively connect said first output terminal and said second output terminal together when said equalization signal is applied to said equalization terminal and operatively disconnect said first output terminal and said second output terminal from one another when said equalization signal is removed from said equalization terminal.

27. A differential sense amplifier receptive of a differential input signal that is defined by a first input signal and a second input signal which is different than the first input signal, and for supplying an amplified differential output signal that is defined by a first output signal and a second output signal which is different than the first output signal, comprising:

a first amplifying portion that includes a first input terminal for receiving the first input signal, a first reference branch for providing a first reference signal at a first reference node, a first amplifying branch that uses said first reference signal in amplifying the first input signal to produce the first output signal, and a first output terminal for outputting the first output signal provided by said first amplifying branch;

a second amplifying portion that includes a second input terminal for receiving the second input signal, a second reference branch for providing a second reference signal at a second reference node, a second amplifying branch that uses said second reference signal in amplifying the second input signal to produce the second output signal, and a second output terminal for outputting the second output signal provided by said second amplifying branch;

means for selectively latching the first and second output signals;

means for selectively disabling said first and second amplifying portions to prevent said first and second amplifying portions from conducting current from a power supply;

means for selectively equilibrating said first and second input terminals, wherein a common potential is applied to said first and second input terminals when said means for selectively equilibrating is selected;

means for selectively equalizing said first and second output terminals that includes means for connecting said first output terminal, said first reference node, said second output terminal, and said second reference node, wherein a common potential is applied to said first output terminal, said first reference node, said second output terminal, and said second reference node when said means for selectively equalizing is selected; and means for use in providing the first input signal to said second reference branch and the second input signal to said first reference branch, wherein said first reference signal produced by said first reference branch at said first reference node changes in magnitude oppositely to a change in the first input signal applied to said first amplifying branch and said second reference signal produced by said second reference branch at said second reference node changes in magnitude oppositely to a change in the second input signal applied to said second amplifying branch to increase the gain from each of said first and second amplifying branches.

* * * * *